United States Patent [19]

Pricer

[11] 4,384,216
[45] May 17, 1983

[54] CONTROLLED POWER PERFORMANCE DRIVER CIRCUIT

[75] Inventor: Wilbur D. Pricer, Burlington, Vt.

[73] Assignee: International Business Machines Corporation, Armonk, N.Y.

[21] Appl. No.: 180,242

[22] Filed: Aug. 22, 1980

[51] Int. Cl.³ .............................................. H03K 5/12
[52] U.S. Cl. .................................... 307/270; 307/263; 307/448; 307/450
[58] Field of Search ............... 307/263, 270, 448, 450, 307/454, 456, 457, 475

[56] References Cited

U.S. PATENT DOCUMENTS

| | | | |
|---|---|---|---|
| 3,271,590 | 9/1966 | Sturman | 307/454 |
| 3,381,144 | 4/1968 | Thomas | 307/457 |
| 3,553,601 | 1/1971 | Glasser | 307/270 |
| 3,775,693 | 11/1973 | Proebsting . | |
| 4,117,353 | 9/1978 | Butler et al. . | |
| 4,161,039 | 7/1979 | Rössler . | |

OTHER PUBLICATIONS

T. P. Cauge et al., "Double-Diffused MOS Transistor Achieves Microwave Gain", Electronics, Feb. 15, 1971, pp. 99-104.

Primary Examiner—John Zazworsky
Attorney, Agent, or Firm—Stephen J. Limanek

[57] ABSTRACT

The circuit rapidly charges and discharges a load capacitor by sensing the direction of transients at an internal node of the circuit which is selectively isolated from a capacitive output node to produce significant load current during upward transients. In an embodiment of the invention, the circuit includes a driver device and first, second and third field effect transistors. The first transistor is connected between a voltage supply terminal and the driver device forming an internal node between the first transistor and the driver device and acts as a current source pulling up the internal node. The second transistor is connected between the internal node and an output node and is arranged to selectively isolate the internal node from the output node, with isolation increasing during a positive transient to allow maximum drive to the third transistor connected between the voltage supply terminal and the output node to produce increased output current. The second transistor is also arranged to minimize the isolation between the internal and output nodes during negative transients to rapidly discharge the output node.

15 Claims, 4 Drawing Figures

CONTROLLED POWER PERFORMANCE DRIVER CIRCUIT

DESCRIPTION

1. Technical Field

This invention relates to integrated semiconductor driver circuits and more particularly to transistor driver or inverter or inverting logic circuits having improved power performance factors.

2. Background Art

Most load devices, whether used in drivers, inverters or other specialized circuits, or in logic or memory amplifiers, may be classified as passive, active or clocked loads.

Passive loads, such as resistors, are well known and generally are the simplest devices. In most applications, resistive loads consume the most power for a given performance since they deliver the most current to the driver transistor when the driver transistor is turned on.

Active loads, which may also be referred to as constant current source loads, are generally more complex than resistive loads and are typically lateral PNP transistors or depletion mode devices biased to act as current sources. The active loads deliver their full power during the turn off transient and, therefore, this transient is considerably faster than that of the passive load for equal power dissipation.

Clocked loads deliver load current only at specified time periods. These loads are most effectively used where transients are relatively infrequent and their periods of occurrence are highly predictable. In such applications, clocked loads utilize a small amount of power with generally very satisfactory performance. These loads are generally unsatisfactory for random logic, amplifiers and most high performance circuits.

An example of a known logic inverter circuit having active loads utilizing depletion mode devices with enhancement mode device drivers is disclosed in U.S. Pat. No. 3,775,693, filed on Nov. 29, 1971. To obtain extra drive this inverter circuit requires an extra stage with attendant power dissipation and stage delay.

Another known circuit which uses both depletion and enhancement mode devices or transistors is disclosed in U.S. Pat. No. 4,117,353, filed Dec. 23, 1976. In this patent the depletion and enhancement mode transistors are arranged to provide a constant current source between a power supply terminal and the output node.

DISCLOSURE OF THE INVENTION

It is an object of this invention to provide an improved load circuit.

It is another object of this invention to provide an improved load circuit which has improved performance without increasing power dissipation.

It is still another object of this invention to provide an improved load circuit which saves power when additional transistors are required to obtain extra drive.

It is a further object of this invention to provide an improved load which responds more rapidly when the driver is being turned off.

It is still a further object of this invention to provide an improved load circuit which does not require an additional stage to produce extra drive.

Yet another object of this invention is to provide an improved circuit for rapidly charging and discharging a load capacitor.

In accordance with the teachings of this invention, an improved circuit is provided for rapidly charging and discharging a load capacitor by sensing the direction of transients at an internal node of the circuit which is selectively isolated from a capacitive output node to produce significant load current during upward transients. This circuit, which is a modification of standard active loads, acts as a variable current source load reaching peak or maximum drive current during the middle portion of the turn off transient of the circuit driver. At other times this circuit supplies very little, if any, current.

In an embodiment of this invention, the circuit includes a driver device and first, second and third field effect transistors. The first transistor isconnected between a voltage supply terminal and the driver device forming an internal node between the first transistor and the driver device and acts as a current source pulling up the internal node. The second transistor is connected between the internal node and an output node and is arranged to selectively isolate the internal node from the output node, with isolation increasing during a positive transient to allow maximum drive to the third transistor connected between the voltage supply terminal and the output node to produce increased output current. The second transistor is also arranged to minimize the isolation between the internal and output nodes during negative transients to rapidly discharge the output node.

The foregoing and other objects, features and advantages of the invention will be apparent from the following and more particular description of the preferred embodiments of the invention, as illustrated in the accompanying drawing.

BEST MODE FOR CARRYING OUT THE INVENTION

Figure 1:
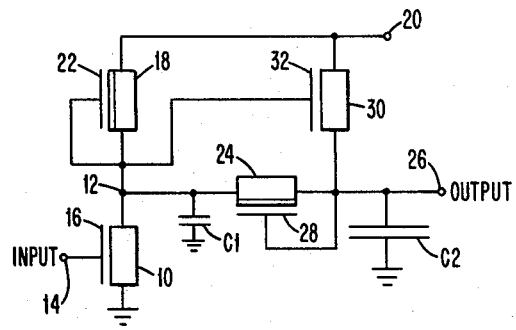
FIG. 1 is a circuit diagram illustrating a first embodiment of the present invention.

Referring to FIG. 1 of the drawing in more detail, there is shown a circuit diagram of a first embodiment of the present invention. The circuit of FIG. 1 includes a first field effect transistor 10 connected between an internal node 12 and a point of reference potential such as ground, and an input node or terminal 14 connected to the control gate 16 of transistor 10, which acts as a driver device. A second field effect transistor 18, connected between internal node 12 and a voltage supply terminal 20 and having its control gate 22 connected to internal node 12, acts as a current source. A third field effect transistor 24, connected between internal node 12 and an output node or terminal 26 and having its control gate 28 connected to the output node 26 in a diode arrangement, acts as a selective or partial isolation device. A fourth field effect transistor 30, connected between the voltage supply terminal 20 and the output node 26 and having its control gate 32 connected to the internal node, acts as a source follower. Internal node 12 may be adapted to receive a logic input by connecting other driver devices like transistor 10 at node 12. A small parasitic capacitance is indicated at the internal node 12 by a capacitor C1, and a load capacitance, which is preferably at least an order of magnitude greater than that of the internal node capacitor C1, is indicateb by a capacitor C2. Transistors 10 and 30 are of the enhancement type and transistors 18 and 24 are of the depletion type. Depletion transistor 24 is preferably designed to have a current bias of one half of that of depletion transistor 18, i.e., one half the width to length ratio.

Figure 2:
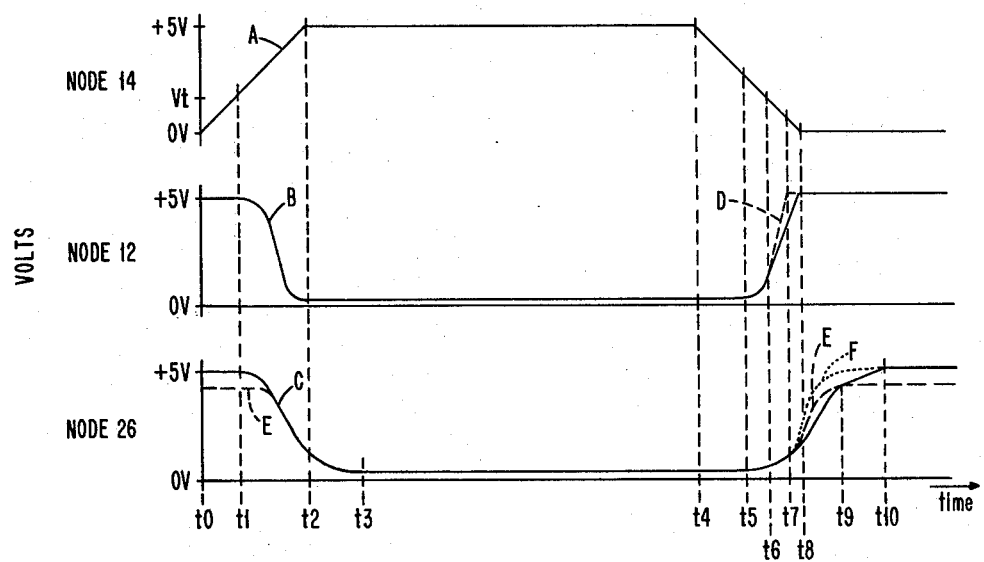
FIG. 2 is a graph of the voltage with respect to time at a number of nodes or terminals within the circuits of the present invention, as illustrated, e.g., in FIG. 1 of the drawing during switching transitions.

To better understand the operation of the circuit of FIG. 1, reference may be had to the graph shown in FIG. 2 of the drawing. With zero volts applied to input node or terminal 14, as indicated at time t0 in FIG. 2, the voltage at the internal node 12 is at approximately +5 volts, as is the voltage at the output terminal 26. With the voltage at the input terminal 14 increasing to a threshold voltage $V_t$, as indicated by curve A at time t1, transistor 10 begins to turn on discharging the small capacitor C1 and, thus, rapidly decreasing the voltage at internal node 12. At time t2, the voltage at input terminal 14 is at its maximum value, e.g., +5 volts and the small capacitor C1 is substantially fully discharged, as indicated by curve B, lowering the voltage at the internal node 12 to approximately 200 millivolts, which lower voltage is determined by the voltage drop across the second transistor 18. With the voltage at internal node 12 rapidly decreasing between times t1 and t2, and the depletion transistor 28 turns on hard to discharge the output terminal 26 through the first transistor 10, while the fourth transistor or source follower 30 is being turned off. The discharge, to about 200 millivolts, of the output terminal 26, which is connected to the large capacitive load, capacitor C2, takes place between times t1 and t3, as indicated by curve C in FIG. 2 of the drawings, to complete the negative transistion at the output terminal 26.

To begin the positive transistion at the output terminal 26, the voltage at the input terminal is decreased at time t4 and reaches the threshold voltage $V_t$ at time t6 when the first or drive transistor 10 is turned off. Prior to turning off the first transistor 10, i.e., at time t5, the current through the first transistor begins to decrease causing charge to accummulate on the small internal node capacitor C1. This build up of charge or voltage on capacitor C1 starts to turn on the fourth transistor 30 which begins to supply current to the large output load capacitor C2. When the first or drive transistor 10 is completely turned off at time t6, the voltage on capacitor C1 increases rapidly building up to approximately +5 volts at time t8. This rapid build up of voltage at internal node 12 turns on the fourth transistor hard to charge the large output capacitor to a voltage one threshold less than +5 volts by time t9. The remaining charge to +5 volts by time t10 is supplied by transistors 18 and 24. It should be noted that by utilizing the circuit of the present invention, the large output capacitor is fully charged between times t5 and t10 which can be a span of time no greater than 10 nanoseconds, where the time required to charge a similar large output capacitor to the same voltage by known circuits would require about 100 nanoseconds, i.e., at least ten times as long. It should also be noted that in the circuit of this invention the power dissipation is low since only one direct current path is produced in the circuit between the voltage supply terminal 20 and ground, i.e., only when both transistors 10 and 18 are on simultaneously.

Figure 3:
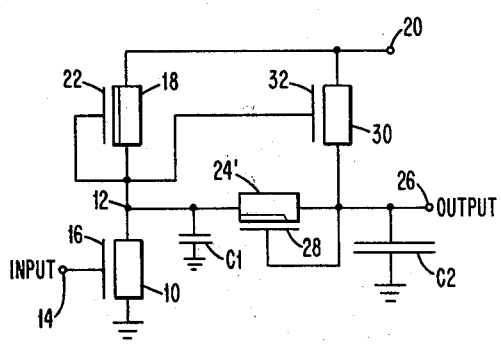
FIG. 3 is a circuit diagram illustrating a second embodiment of the present invention.

A second embodiment of the present invention is illustrated by the circuit of FIG. 3 of the drawing. The circuit of FIG. 3 is similar to that of FIG. 1 of the drawing except that the third or isolating depletion transistor 24 of FIG. 1 is replaced by a two threshold voltage transistor indicated in FIG. 3 by transistor 24'. The two threshold voltage transistor may be made as a conventional depletion transistor except for a high threshold material disposed in the channel of the transistor near the current carrying electrode connected to the output terminal 26. If desired this transistor may be made by the well-known DMOS process, as, e.g., described in *Electronics,* Feb. 15, 1971, pp. 99–104, in an article entitled "Double-Diffused MOS Transistor Achieves Microwave Gain" by T. P. Cauge et al or in U.S. Pat. No. 4,161,039 filed on Feb. 6, 1978. If such a depletion transistor were an N channel transistor, the semiconductor substrate would be made of P type material, the source/drain or current carrying electrodes being N+ with a P region formed in the channel end of the transistor nearer to output terminal 26. As is known, when a high voltage is applied to the current carrying electrode adjacent to this P region, the effect of the P region on the channel is neutralized, but when the high voltage is applied to the current carrying electrode remote from the P region, the transistor exhibits a high threshold voltage. Transistor 24' may have a width to length ratio the same as that of depletion transistor 18.

The circuit of FIG. 3 of the drawing operates in a manner similar to that of FIG. 1 except that during the positive transition the voltage at the internal node 12 rises more rapidly, as indicated by dashed line D in FIG. 2 between times t6 and t7. This more rapid rise in voltage is due to the increased isolation between the output node 26 and the internal node 12 due to the higher threshold exhibited by the transistor 24' when the voltage at the output node 26 is at a low value. The voltage at the internal node 12 of the circuit in FIG. 3 is similar to that of the circuit of FIG. 1 except for the time interval between times t6 and t8. Since the voltage at the internal node 12 increases more rapidly in the circuit of FIG. 3, it can be seen that the fourth transistor or source follower 30 turns on sooner to more rapidly increase the voltage at the output node 26, as indicated by dashed curve E. It should be noted that although the voltage at the output node 26 of the circuit of FIG. 3 rises more rapidly than that of the circuit of FIG. 1 and reaches its peak at time t9, the output voltage rises only to within a threshold voltage $V_t$ of the output voltage of the circuit of FIG. 1 due to the presence of the P region in the transistor 24'. The low voltage at the output nodes 26 of both circuits is the same, approximately 200 millivolts.

Figure 4:
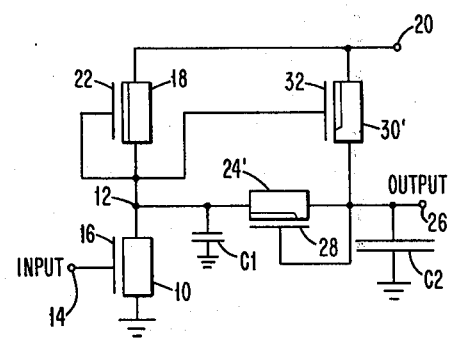
FIG. 4 is a circuit diagram illustrating a third embodiment of the present invention.

A third embodiment of the present invention is illustrated by the circuit of FIG. 4 of the drawing. The circuit of FIG. 4 is similar to that of FIG. 3 of the drawing except that the fourth transistor or source follower 30 of FIG. 3 is replaced by a two threshold voltage transistor indicated in FIG. 4 by transistor 30'. The transistor 30' is preferably similar to the transistor 24' of FIG. 3 with its P region being located adjacent to the N+ region located nearer to the output node 26.

The circuit of FIG. 4 of the drawing operates in a manner similar to that of FIG. 3 except that during the positive transistion the voltage at the output node 26 rises more rapidly due to the higher conductance of the source follower 30', as indicated by dotted line curve F in FIG. 2 of the drawing. The transistor 30' preferably exhibits a zero volt threshold voltage and has a very low on impedance due to its depletion channel. Since the threshold voltage of transistor 30' is substantially zero, it should be noted that the output voltage in the circuit of FIG. 4 rises to approximately +5 volts as it does in the circuit of FIG. 1. The low voltage at the node of the circuit of FIG. 4 is approximately of the same value as that of the circuits of FIGS. 1 and 3.

It can be seen that, where desirable, the width to length ratio of the fourth transistor of the circuits of FIGS. 1, 3 and 4 can be increased considerably. This ratio may be increased regardless of whether the fourth transistor is a dual threshold voltage device or not. This transistor 30 or 30' contributes positive transient current only and does not contribute to static power dissipation.

It should also be noted that the circuits of the present invention, when heavily loaded, perform four or five times faster at the same power dissipation than conventional circuits using depletion loads. The positive transient to logic threshold is about ten times faster, although the negative transient to logic threshold is somewhat slower than that of conventional circuits due to the series impedance produced by the depletion transistor 24 or 24'.

While the invention has been particularly shown and described with reference to preferred embodiments thereof, it will be understood by those skilled in the art that various changes in form and details may be made therein without departing from the spirit and scope of the invention.

What is claimed is:

1. A circuit comprising;
    a driver device coupled to an internal node,
    a first depletion mode transistor coupled between said internal node and a power supply terminal and controlled by said internal node,
    a second depletion mode transistor coupled between said internal node and an output node, said second transistor arranged to provide a low impedance value when a voltage on said output node is higher than the voltage on said internal node, and
    an active device coupled between said power supply terminal and said output node and controlled by said internal node.

2. A circuit as set forth in claim 1 wherein said second depletion mode transistor is arranged as a diode.

3. A circuit as set forth in claim 2 wherein said second transistor has a channel with first and second materials, said second material being disposed adjacent said output node and providing a higher threshold voltage than said first material.

4. A circuit as set forth in claim 2 wherein said second transistor is a field effect transistor having a control gate connected to said output node.

5. A circuit as set forth in claim 2 wherein said first transistor is a field effect depletion mode transistor having a control gate connected to said internal node.

6. A circuit as set forth in claim 2 wherein said active device is an enhancement mode transistor.

7. A circuit as set forth in claim 2 wherein said active device is a two threshold voltage device.

8. A circuit as set forth in claim 1 further including;
    a first capacitor having a given capacitance value connected to said internal node, and
    a second capacitor having a capacitance value significantly greater than that of said first capacitor connected to said output node.

9. A circuit as set forth in claim 8 wherein the capacitance value of said second capacitor is at least ten times greater than that of said first capacitor.

10. A driver circuit comprising;
    an enhancement mode transistor connected between an internal node and a point of reference potential,
    a first depletion mode transistor coupled between said internal node and a power supply terminal and having a control gate connected to said internal node,
    a second depletion mode transistor coupled between said internal node and an output node, said second transistor having a control gate connected to said output node, and
    a source follower coupled between said power supply terminal and said output node and controlled by said internal node.

11. A driver circuit as set forth in claim 10 further including;
    a first capacitance having a given capacitor value connected to said internal node and
    a second capacitor having a capacitance value significantly greater than that of said first capacitor connected to said output node.

12. A driver circuit as set forth in claim 11 wherein said second depletion mode transistor has two different threshold voltage values.

13. A driver circuit as set forth in claim 11 wherein said source follower is a second enhancement mode field effect transistor.

14. A driver circuit as set forth in claim 13 wherein said second enhancement mode field effect transistor has a control gate connected to said internal node.

15. A driver circuit as set forth in claim 11 wherein said source follower is a depletion mode transistor having two different threshold voltage values.

* * * * *